US006903985B1

(12) United States Patent
Wu et al.

(10) Patent No.: US 6,903,985 B1
(45) Date of Patent: Jun. 7, 2005

(54) METHOD AND CIRCUIT FOR MATCHING SENSE AMPLIFIER TRIGGER SIGNAL TIMING TO DATA BIT LINE SEPARATION TIMING IN A SELF-TIMED MEMORY ARRAY

(75) Inventors: Sifang Wu, Savage, MN (US); Dave Grover, Eden Prairie, MN (US); Allen Faber, Vancouver, WA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/853,637

(22) Filed: May 24, 2004

(51) Int. Cl.[7] .................................................. G11C 7/00
(52) U.S. Cl. ........................ 365/194; 365/205; 365/207; 365/208
(58) Field of Search .................................. 365/194, 205, 365/207, 208

(56) References Cited

U.S. PATENT DOCUMENTS 4,421,996 A * 12/1983 Chuang et al. ................ 327/57
5,053,998 A * 10/1991 Kannan et al. ............. 365/194

* cited by examiner

Primary Examiner—Vu A. Le
(74) Attorney, Agent, or Firm—Fitch, Even, Tabin & Flannery

(57) ABSTRACT

A circuit for matching sense amplifier trigger signal timing to data bit line separation timing in a self-timed memory array includes: a source of a self-timed word line signal for a self-timed memory array; a transmission gate coupled to the source of the self-timed word line signal for propagating a timing delay and a ramp rate of the self-timed word line signal in response to a corresponding self-timed word line enable signal; and a selectable number of one or more self-timed pull-down core cells for summing a self-timed bit line drive current of each of the selectable number of one or more self-timed pull-down core cells to generate a sense amplifier trigger signal.

17 Claims, 7 Drawing Sheets

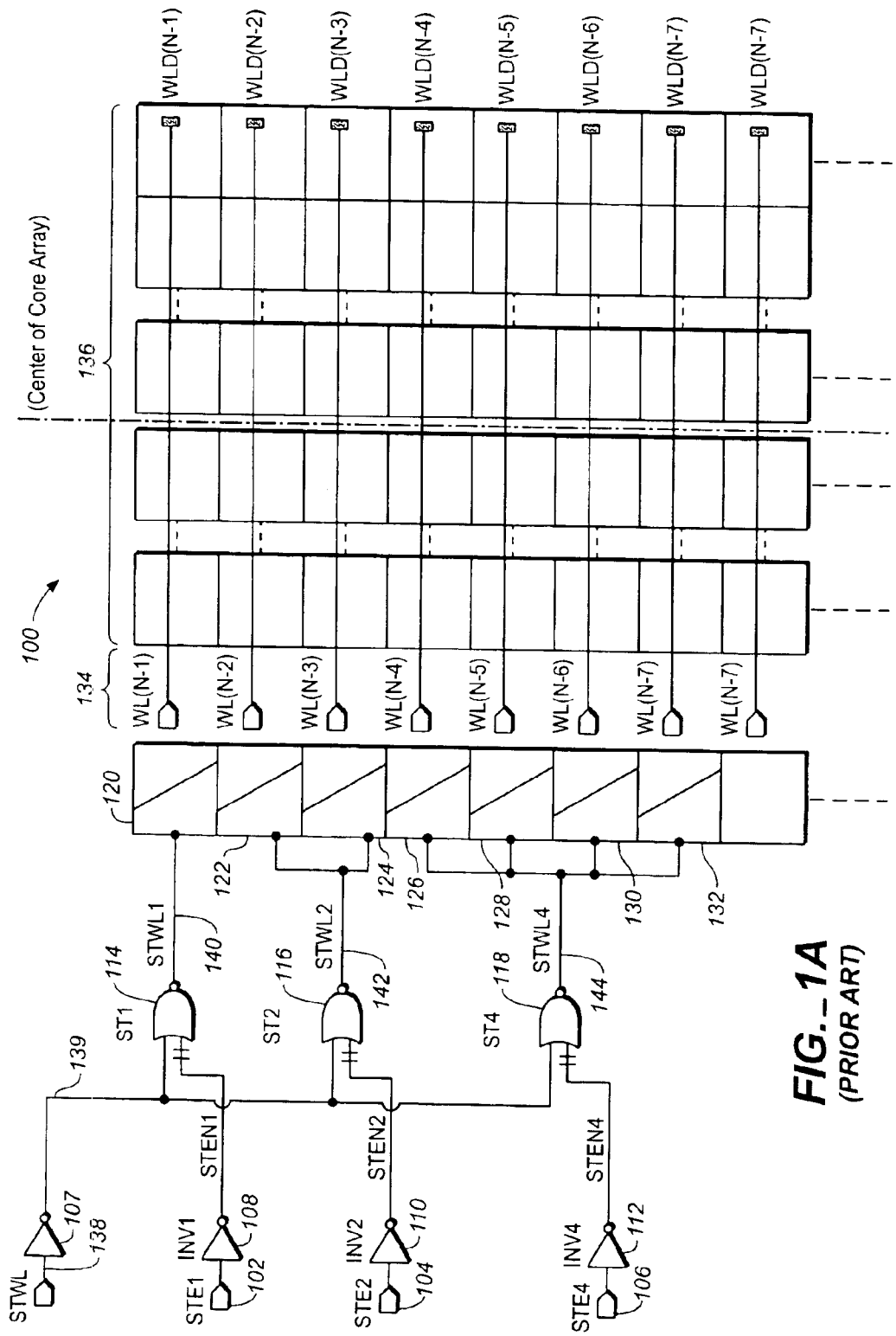
FIG._1A
(PRIOR ART)

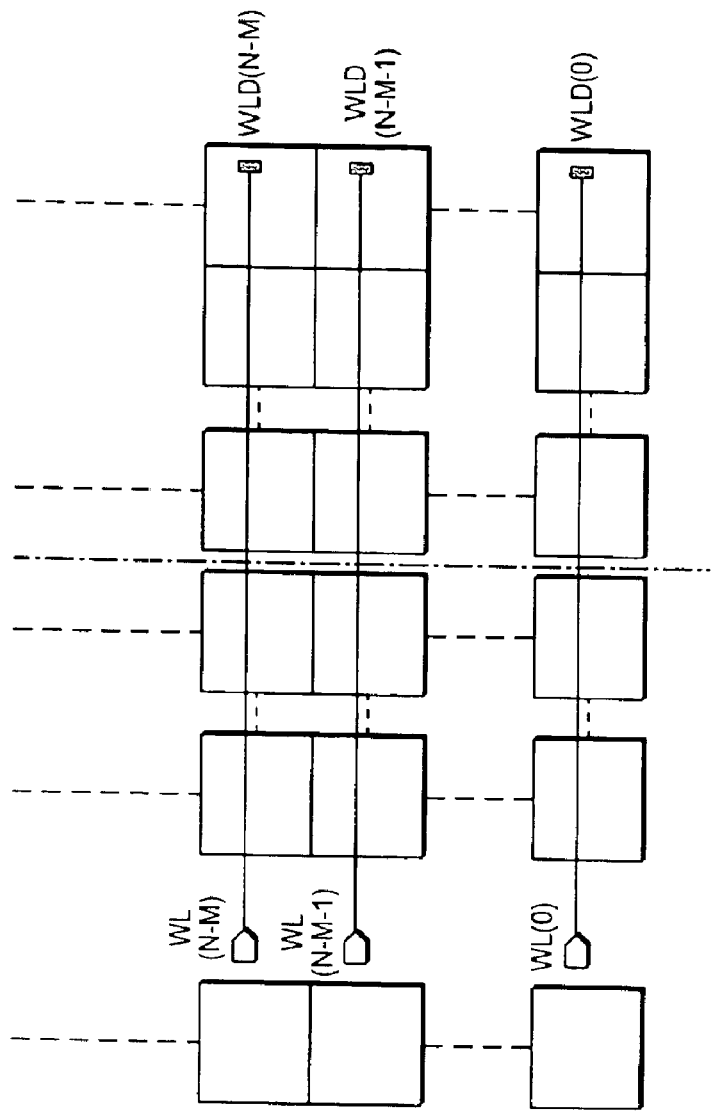
FIG._1B
*(PRIOR ART)*
FIG._1
*(PRIOR ART)*

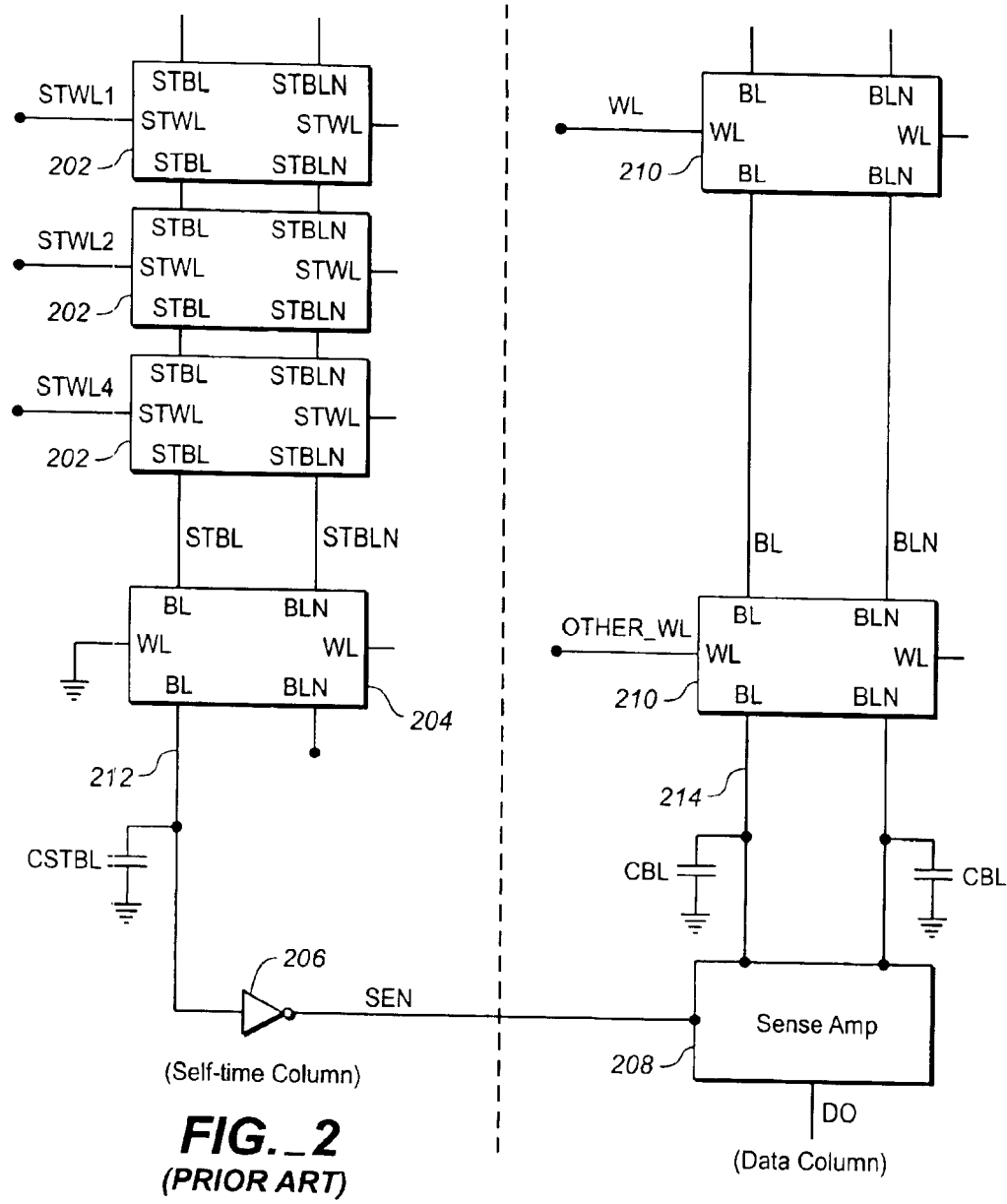
FIG._2
(PRIOR ART)
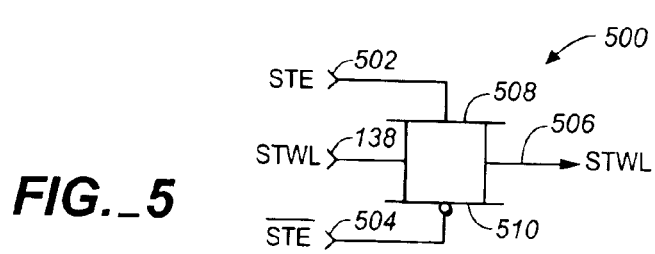
FIG._5

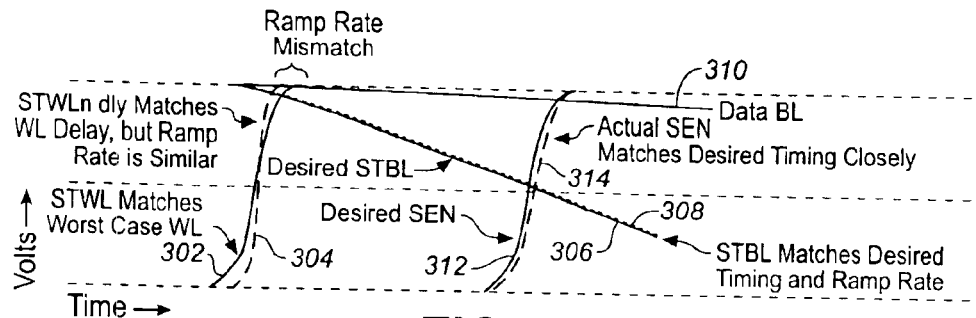
FIG._3A
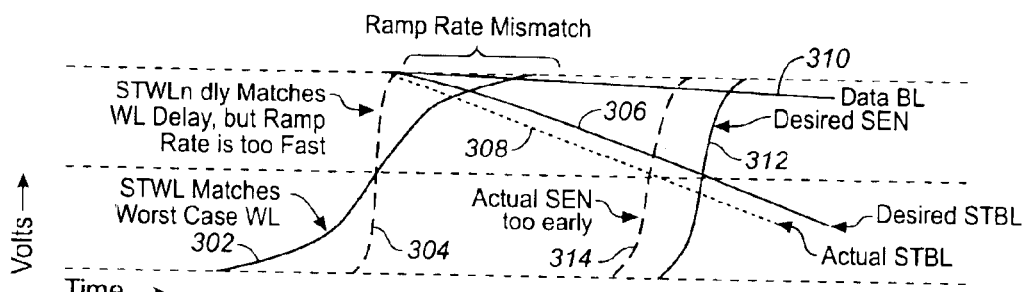
FIG._3B
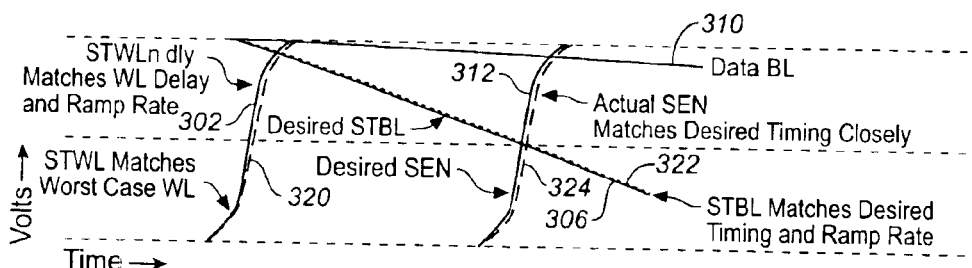
FIG._3C
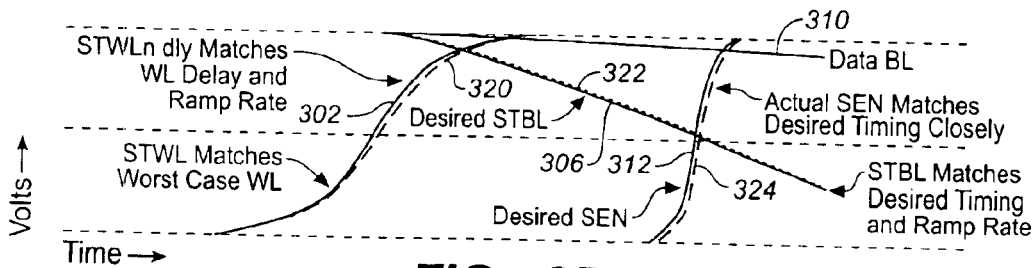
FIG._3D

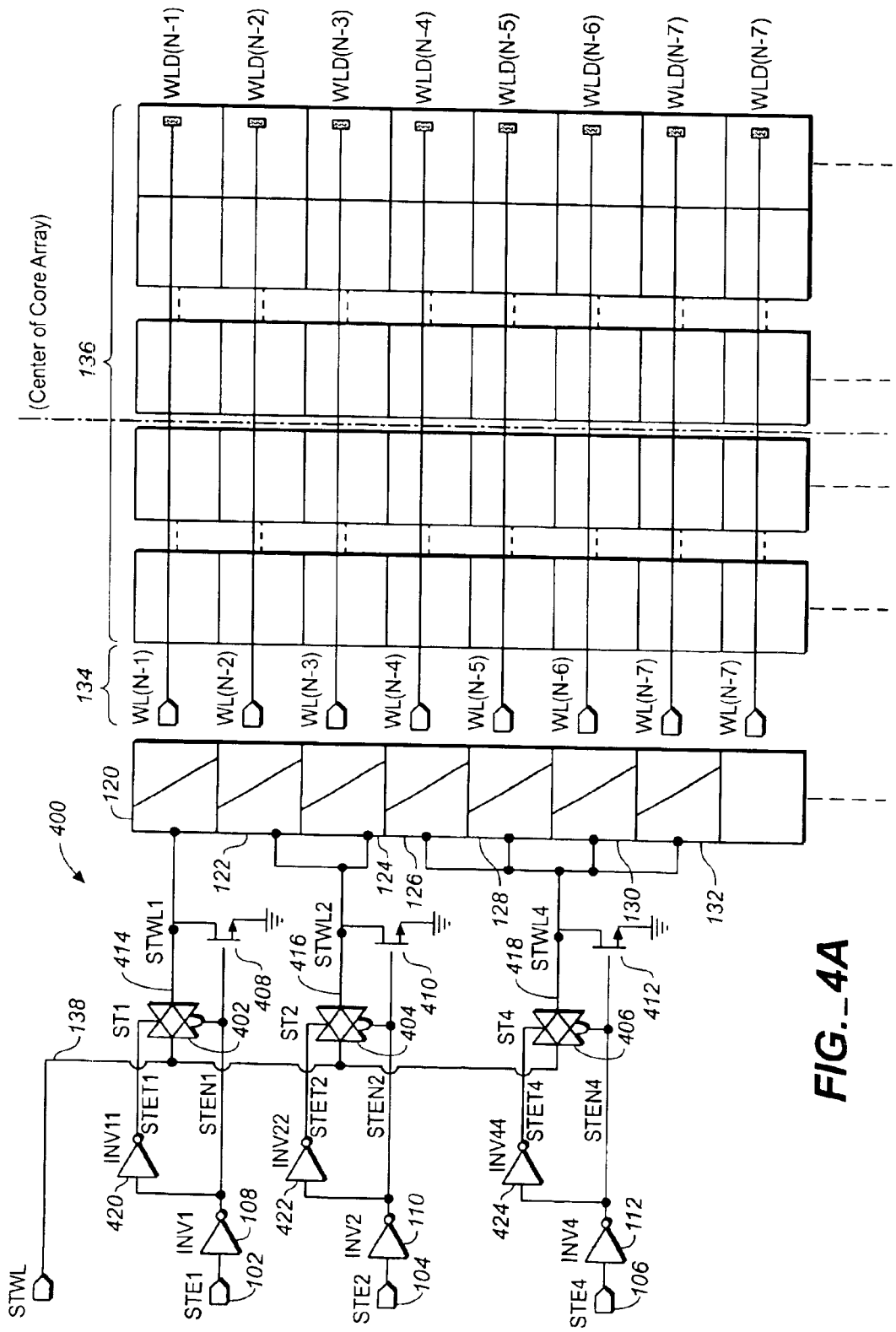
FIG._4A

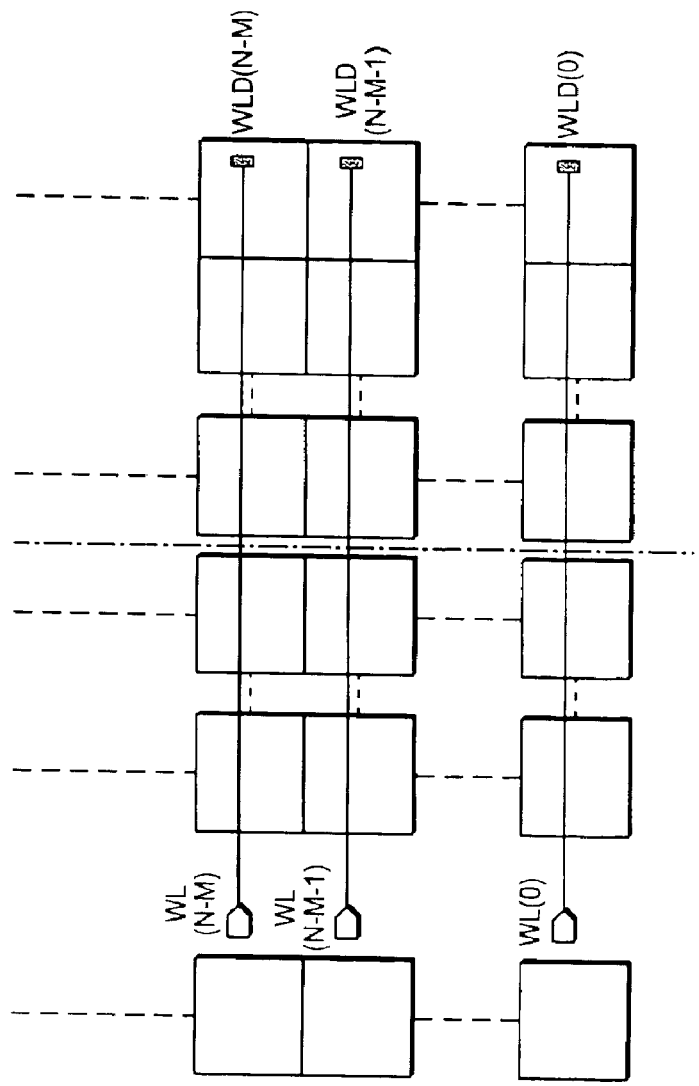
FIG._4B
FIG._4
FIG._4A
FIG._4B

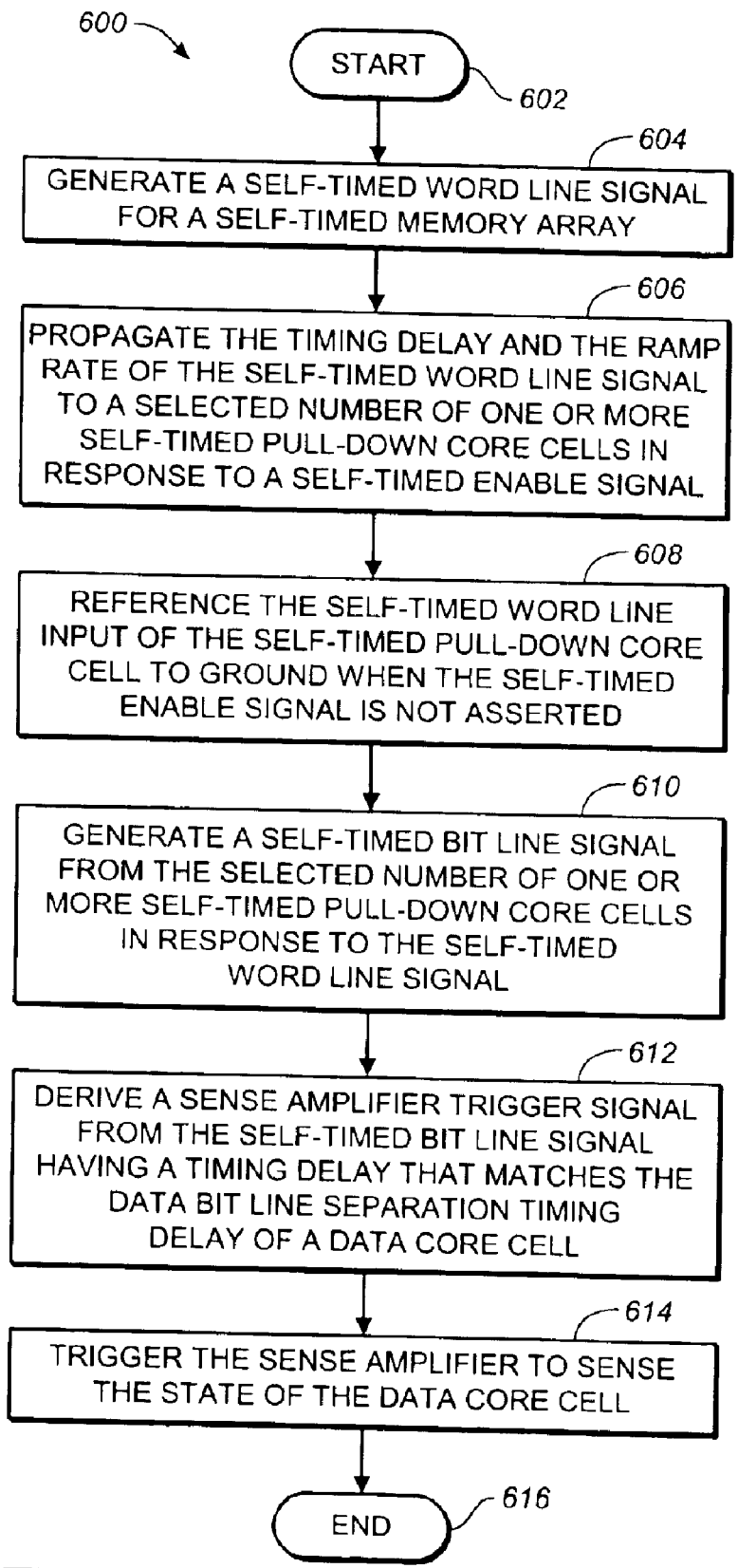
FIG._6

US 6,903,985 B1

METHOD AND CIRCUIT FOR MATCHING SENSE AMPLIFIER TRIGGER SIGNAL TIMING TO DATA BIT LINE SEPARATION TIMING IN A SELF-TIMED MEMORY ARRAY

BACKGROUND OF THE INVENTION

1. Field of the Invention

The present invention is directed to memory arrays used in the design of integrated circuits. More specifically, but without limitation thereto, the present invention is directed to the design of self-timed memory arrays.

2. Description of Related Art

Different types and sizes of memory arrays typically used in integrated circuit designs operate at different speeds. One method of accommodating read control circuitry to a specific memory speed is to insert a selectable fixed timing delay after a clock signal to trigger the sense amplifiers of a memory array after a sufficient interval has passed to ensure a correct reading of a data cell. A disadvantage of using a fixed timing delay is that the amount of delay required varies within a range determined by processing characteristics and other factors, complicating the design of memory array read/write circuits. Simply using a large delay would sacrifice the performance speed of the memory array, resulting in a loss of competitiveness with other memory array designs. In a self-timed memory array, the timing delay of the sense amplifier trigger signal is matched to the timing delay of the data bit lines of the memory array by deriving the timing of the sense amplifier trigger signal from a selectable number of self-timed pull-down core cells that have a structure identical to that of the data cells in the memory array. The self-timed pull-down core cells generate a self-timed bit line signal that controls the amount of delay before the sense amplifier is triggered, compensating automatically for process variations and memory size. Because the timing of the sense amplifier trigger signal is determined by the same type of core cells used in the memory array, the memory array is called a self-timed memory array.

SUMMARY OF THE INVENTION

In one embodiment of the present invention, a circuit for matching sense amplifier trigger signal timing to bit line separation timing includes: a source of a self-timed word line signal for a self-timed memory array; a transmission gate coupled to the source of the self-timed word line signal for propagating a timing delay and a ramp rate of the self-timed word line signal in response to a corresponding self-timed word line enable signal; and a selectable number of one or more self-timed pull-down core cells for summing a self-timed bit line drive current of each of the selectable number of one or more self-timed pull-down core cells to generate a sense amplifier trigger signal.

In another embodiment of the present invention, a method of matching sense amplifier trigger signal timing to bit line separation timing includes steps of:
(a) providing a self-timed word line signal for a self-timed memory array;
(b) propagating a timing and a ramp rate of the self-timed word line signal to a selectable number of one or more self-timed pull-down core cells in response to a corresponding self-timed word line enable signal; and
(c) summing a self-timed bit line drive current over the selectable number of one or more self-timed pull-down core cells to generate a sense amplifier trigger signal.

BRIEF DESCRIPTION OF THE DRAWINGS

The present invention is illustrated by way of example and not limitation in the accompanying figures, in which like references indicate similar elements throughout the several views of the drawings, and in which:

FIG. 1 illustrates a self-timed memory array according to the prior art;

FIG. 2 illustrates a diagram of a sense amplifier circuit of the prior art for the self-timed memory array of FIG. 1;

FIGS. 3A and 3B illustrate timing delay and ramp rates for the self-timed memory array of FIG. 1;

FIGS. 3C and 3D illustrate timing delay and ramp rates for a self-timed memory array according to an embodiment of the present invention;

FIG. 4 illustrates a circuit for matching sense amplifier trigger signal timing to bit line separation timing in a self-timed memory array according to an embodiment of the present invention;

FIG. 5 illustrates an example of a transmission gate that may be used in the circuit of FIG. 4; and FIG. 6 illustrates a flow chart of a method of matching sense trigger signal timing to bit line separation timing according to an embodiment of the present invention.

For convenience, signal names are used is interchangeably with signal lines, for example, "self-timed word line" is equivalent to "self-timed word line signal".

Elements in the figures are illustrated for simplicity and clarity and have not necessarily been drawn to scale. For example, the dimensions of some elements in the figures may be exaggerated relative to other elements to point out distinctive features in the illustrated embodiments of the present invention.

DETAILED DESCRIPTION OF THE ILLUSTRATED EMBODIMENTS

FIG. 1 illustrates a self-timed memory array 100 according to the prior art. Shown in FIG. 1 are self-timed word line enable signals STE1 102, STE2 104 and STE4 106, inverters 107, 108, 110 and 112, NOR gates 114, 116 and 118, self-timed pull-down core cells 120, 122, 124, 126, 128, 130 and 132, data word lines 134, data core cells 136, a self-timed word line signal STWL 138, an inverted self-timed word line signal STWL 139, and selected gated self-timed word lines STWL1 140, STWL2 142 and STWL4 144.

In FIG. 1, the gated self-timed word lines STWLI 140, STWL2 142 and STWL4 144 are each connected to a corresponding number of self-timed pull-down core cells. For example, the gated self-timed word line STWL1 140 is connected to the self-timed pull-down core cell 120, the gated self-timed word line STWIL2 142 is connected to the self-timed pull-down core cells 122 and 124, and the gated self-timed word line STWL4 144 is connected to the self-timed pull-down core cells 126, 128, 130 and 132. By arranging the self-timed pull-down core cells in groups of powers of two as in the example of FIG. 1, any number of the self-timed pull-down core cells is conveniently selectable by asserting or not asserting each of the self-timed word line enable signals STE[n] with the binary representation of the desired number of the self-timed pull-down core cells. For example, five (101 in binary code) self-timed pull-down core cells may be conveniently selected by asserting STE1, negating STE2, and asserting STE4.

Various methods are well known in the art for sourcing the self-timed word line signal STWL 138. In the example of FIG. 1, the self-timed word line signal STWL 138 is inverted by the inverter 107 to generate the inverted self-timed word line signal STWL 139, and the gated self-timed word line signals STWL1 140, STWL2 142 and STWL4 144 are non-inverted signals. The self-timed word line STWL 138 tracks the slowest data word line 134 of the data core cells 136 in the self-timed memory array, that is, the timing delay and the ramp rate of the self-timed word line STWL 138 are substantially identical to that of the slowest data word line 134. Consequently, the inverted self-timed word line signal STWL 139 has a timing delay that tracks the worst case delay of the data word lines 134, however the ramp rate of the inverted self-timed word line signal STWL 139 from the inverter 107 may be substantially different from that of the self-timed word line STWL 138. The importance of the difference in ramp rates will be described in greater detail below. The inverted self-timed word line signal STWL 139 is gated to a number of one or more self-timed pull-down core cells via the gated self-timed word lines STWL1 140, STWL2 142 and STWL4 144. The number of self-timed pull-down core cells is selectable by an appropriate combination of asserted and non-asserted self-timed word line enable signals STE1 102, STE2 104 and STE4 106.

FIG. 2 illustrates a diagram of a sense amplifier circuit of the prior art for the self-timed memory array of FIG. 1. Shown in FIG. 2 are self-timed pull-down core cells 202, delay core cells 204, a sense inverter 206, a sense amplifier 208, data core cells 210, a self-timed bit line signal 212, and a data bit line signal 214.

In FIG. 2, the self-timed bit line signal 212 from the selected number of self-timed pull-down core cells 202 and the delay core cells 204 is output to the sense inverter 206. The capacitance of the self-timed bit line CSTBL is matched to the data bit line capacitance CBL of the data core cells 210 by the delay core cells 204 to match the worst case timing delay of the data core cells 210 in the memory array. The self-timed bit line signal STBL 212 is received by the sense inverter 206. The sense amplifier 208 is triggered by the inverted self-timed bit line signal 212 from the sense inverter 206. Upon triggering, the sense amplifier 208 senses the state of the selected data core cell 210.

A number M of self-timed pull-down core cells 202 is used to discharge the self-timed bit line STBL 212 to a self-timed bit line voltage Vstbl while the data bit line BL 214 is discharged to a data bit line voltage Vbl. The self-timed bit line voltage Vstbl is the switching point of the sense inverter 206 that generates the sense enable, or trigger signal, to the sense amplifier 208. The data bit line voltage Vbl is the bit line separation voltage required by the sense amplifier 208 to correctly sense the state of the data core cells 210. For example, the data bit line voltage Vbl may be 150 mV, and the switching point of the sense inverter may be Vstbl=Vdd/2=0.9 V. If the self-timed bit line current of each of the M self-timed pull-down core cells 202 is identical to the data bit line current, then the relation between Vstbl and Vbl may be expressed as:

$$Vstbl = M * Vbl \quad (1)$$

The number M of self-timed pull-down core cells 202 required in this example is given by:

$$900\ mV = M * 150\ mV \quad (2)$$

M=6

The number M=6 of the self-timed pull-down core cells 202 required to match the trigger timing of the sense amplifier 208 with the discharge rate of the data bit line BL may then be selected by negating STE1 and asserting STE2 and STE4 in FIG. 1. In the same manner, other data bit line voltage levels may be matched by selecting the appropriate number of the self-timed pull-down core cells 202. Because the structure of the self-timed pull-down core cells 202 and the delay core cells 204 is identical to that of the data core cells 210, the timing delay of the sense amplifier trigger signal derived from the self-timed bit line signal 212 is supposed to match the data bit line separation timing delay of the data bit line signals 214.

A problem in the circuit design of FIG. 1 is that if the ramp rate of the gated self-timed word lines STWL1 140, STWL2 142 and STWL4 144 is faster than the ramp rate of the self-timed word line STWL 138, then the sense trigger signal may occur before the data bit line has had enough time to discharge to the bit line separation voltage Vbl, resulting in a false read.

FIGS. 3A and 3B illustrate timing delay and ramp rates for the self-timed memory array of FIG. 1. Shown in FIGS. 3A and 3B are a self-timed word line signal 302, a gated self-timed word line signal 304, an ideal self-timed bit line signal 306, an actual self-timed bit line signal 308, a data bit line signal 310, an ideal sense amplifier trigger signal 312, and an actual sense amplifier trigger signal 314.

In the example of FIG. 3A, the timing delay and the ramp rate of the self-timed word line 302 matches the worst case timing delay and ramp rate of the data word lines 134 for a small number of memory columns. However, the self-timed word line signal STWL 138 is inverted by the inverter 107 in FIG. 1 to generate the inverted self-timed word line signal STWL 139, represented in FIG. 3A as the non-inverted self-timed word line 302. The self-timed word line 302 is gated by the NOR gates 114, 116 and 118 in FIG. 1 to generate the gated self-timed word line signal 304. Consequently, the ramp rate of the gated self-timed word line signal 304 corresponds to the faster ramp rate of the inverter 107 and the NOR gates 114, 116 and 118 instead of the ramp rate of the self-timed word line 302. The ramp rate of the NOR gates 114, 116 and 118 is a function of the NOR gate structure and the load represented by the number of self-timed pull-down cells connected to each of the NOR gates 114, 116 and 118 respectively. As a result, the actual self-timed bit line signal 308 is slightly advanced compared to the ideal self-timed bit line signal 306, and the actual sense amplifier trigger signal 314 occurs sooner than the ideal sense amplifier trigger signal 312. For a small number of memory columns, the mismatch in ramp rate between the self-timed word line signal STWL 138 and the gated self-timed word line signal 304 may not be significant enough to prevent a correct reading of the data core cell being sensed.

In the example of FIG. 3B, the timing delay and the ramp rate of the self-timed word line signal STWL 138 matches the worst case timing delay and ramp rate of the data word lines 134 for a large number of memory columns. However, when the self-timed word line signal STWL 138 is inverted by the inverter 107 and gated by the NOR gates 114, 116 and 118 to generate the gated self-timed word line signal 304, the ramp rate of the gated self-timed word line signal 304 corresponds to the faster ramp rate of the inverter 107 and the NOR gates 114, 116 and 118 instead of the much slower ramp rate of the self-timed word line signal STWL 138. As a result, the actual self-timed bit line signal 308 is drastically advanced compared to the ideal self-timed bit line signal 306, and the actual sense amplifier trigger signal 314 occurs too early to match the bit line separation timing delay of the data bit line signal 310 represented by the ideal sense amplifier trigger signal 312. Consequently, the data bit line does not have enough time to discharge to the data bit line separation voltage Vbl, which may result in a false read. For a large number of memory columns, the circuit of FIG. 1 clearly does not sufficiently match the sense amplifier timing delay to the data bit line separation timing delay to ensure correct reading of the data core cells.

The present invention avoids the mismatch between the sense amplifier trigger signal timing delay and the data bit line separation timing delay by transmitting both the timing delay and the ramp rate of the self-timed word line to the self-timed pull-down core cells. Consequently, the self-timed bit line drive current of each of the pull-down core cells is substantially identical to the smallest data bit line drive current for the far end memory column, and the timing delay of the sense amplifier trigger signal adjusts automatically to the data bit line timing delay to ensure correct reading of the sensed data core cell.

An important feature of the present invention is that the transmission of both the timing delay and the ramp rate of the self-timed word line is propagated to the self-timed pull-down core cells to ensure that the self-timed bit line drive current of each of the self-timed pull-down core cells is substantially identical to the smallest data bit line drive current in the memory array.

FIGS. 3C and 3D illustrate timing delay and ramp rates for a self-timed memory array according to an embodiment of the present invention. Shown in FIGS. 3C and 3D are a self-timed word line signal 302, a gated self-timed word line signal 320, an ideal self-timed bit line signal 306, an actual self-timed bit line signal 322, a data bit line signal 310, an ideal sense amplifier trigger signal 312, and an actual sense amplifier trigger signal 324.

In the example of FIG. 3C, the timing delay and the ramp rate of the self-timed word line signal 138 in FIG. 1 represented by the self-timed word line 302 matches the worst case timing delay and ramp rate of the data word lines 134 for a small number of memory columns. In accordance with an embodiment of the present invention, the self-timed word line 302 is gated by a transmission gate instead of the NOR gates 114, 116 and 118 in FIG. 1, so that the gated self-timed word line signal 320 has substantially the same timing delay and the same ramp rate as the self-timed word line signal 138. Consequently, the actual self-timed bit line signal 322 is closely identical to the ideal self-timed bit line signal 306, and the actual sense amplifier trigger signal 324 occurs at the same time as the ideal sense amplifier trigger signal 312.

In the example of FIG. 3D, the timing delay and the ramp rate of the self-timed word line 302 matches the worst case timing delay and ramp rate of the data word lines 134 for a large number of memory columns. In accordance with an embodiment of the present invention, the self-timed word line 302 is gated by a transmission gate instead of the NOR gates 114, 116 and 118 in FIG. 1, so that the gated self-timed word line signal 320 has substantially the same timing delay and the same ramp rate as the self-timed word line 302. Because the self-timed pull-down core cells are driven by a word line signal having the same timing delay and ramp rate as the worst case data word line, the self-timed bit line current of each of the self-timed pull-down core cells is substantially identical to the smallest data bit line current in the self-timed memory array. The longer ramp rate of the gated self-timed word line signal 320 retards the sense amplifier trigger signal timing so that the actual self-timed bit line signal 322 is closely identical to the ideal self-timed bit line signal 306. The actual sense amplifier trigger signal 324 occurs at the same time as the ideal sense amplifier trigger signal 312, because the self-timed bit line drive current of each of the self-timed pull-down core cells is substantially identical to the data bit line drive current. Consequently, the data bit line separation voltage 310 reaches the proper value Vex when the self-timed bit line voltage reaches the sense inverter trigger threshold voltage. As may be appreciated from FIGS. 3C and 3D, the timing delay of the sense amplifier trigger signal is adjusted automatically to the data bit line timing delay to ensure correct reading of the sensed data core cell.

The circuit of the present invention advantageously matches the sense amplifier trigger signal timing delay to the worst case bit line separation timing delay of a self-timed memory array, thereby avoiding the timing delay mismatch of the method illustrated in FIG. 1. In one embodiment of the present invention, a circuit for matching sense amplifier trigger signal timing to bit line separation timing in a self-timed memory array includes: a source of a self-timed word line signal for a self-timed memory array; a transmission gate coupled to the source of the self-timed word line signal for propagating a timing delay and a ramp rate of the self-timed word line signal in response to a corresponding self-timed word line enable signal; and a selectable number of one or more self-timed pull-down core cells for summing a self-timed bit line drive current of each of the selectable number of one or more self-timed pull-down core cells to generate a sense amplifier trigger signal.

FIG. 4 illustrates a circuit 400 for matching a sense amplifier trigger signal timing to data bit line separation timing in a self-timed memory array according to an embodiment of the present invention. Shown in FIG. 4 are self-timed word line enable signals STE1 102, STE2 104 and STE4 106, inverters 108, 110, 112, 420, 422 and 424, self-timed pull-down core cells 120, 122, 124, 126, 128, 130 and 132, data word lines 134, data core cells 136, a self-timed word line STWPL 138, transmission gates 402, 404 and 406, pull-down devices 408, 410 and 412, and selectable gated self-timed word lines STWL1 414, STWL2 416 and STWL4 418.

The circuit 400 of FIG. 4 differs from the circuit of FIG. 1 in that instead of using an inverter and a NOR gate to gate the self-timed word line signal STWL 138 to generate each of the gated self-timed word line signals STWL[n], both the timing delay and the ramp rate of the self-timed word line signal STWL 138 are propagated to the self-timed pull-down core cells 120, 122, 124, 126, 128, 130 and 132 by the transmission gates 402, 404 and 406. The original self-timed word line signal STWL 138 is used in the circuit 400 instead of the inverted self-timed word line signal 139, thereby preserving both the signal timing and the ramp rate of the original self-timed word line signal STWL 138.

The transmission gates 402, 404 and 406 act as switches that connect the self-timed word line STWL 138 to each of the self-timed word line inputs STWL[n] of the self-timed pull-down core cells 120, 122, 124, 126, 128, 130 and 132 respectively when the corresponding self-timed word line enable signals STE[n] are asserted. For example, when STE4 is asserted, the transmission gate 406 is enabled, or switched on, by the inverters 112 and 424. The self-timed word line STWL 138 is connected via the transmission gate 406 to the self-timed word line inputs STWL4 of the four self-timed pull-down core cells 126, 128, 130 and 132 connected to STE4. Because the timing delay and the ramp rates of the self-timed word line signal and of the gated self-timed word lines STWL[n] are identical, the timing delay of the sense trigger signal derived from the self-timed bit line of the self-timed pull-down core cells is matched to the bit line separation timing delay of the selected data core cell in the self-timed memory. When STE[n] is not asserted, the self-timed word line inputs of the corresponding self-timed pull-down core cells are referenced to ground by the pull-down devices 408, 410 and 412. In the illustrated embodiment, the pull-down devices are transistors. In alternative embodiments, devices other than transistors may be used to implement the pull-down devices according to well-known techniques to practice the invention within the scope of the appended claims.

FIG. 5 illustrates an example of a transmission gate 500 that may be used in the circuit of FIG. 4. Shown in FIG. 5 are a self-timed word line signal 138, a self-timed word line enable signal 502, a negated self-timed word line enable signal 504, a switched self-timed word line signal 506, an N-channel transistor 508, and a P-channel transistor 510.

In the circuit of FIG. 5, the self-timed word line signal 138 is the same as that in FIG. 4. The self-timed word line enable signal 502 may be generated, for example, by the inverters 420, 422 and 424 in FIG. 4, while the negated self-timed word line enable signal 506 may be generated, for example, by the inverters 108, 110 and 112. When the self-timed word line enable signal 502 is asserted, both the N-channel transistor 508 and the P-channel transistor 510 are driven into a conducting state, approximating a closed single-pole, single-throw switch that passes the switched self-timed word line signal 506. When the self-timed word line enable signal 502 is negated, both the N-channel transistor 508 and the P-channel transistor 510 are driven into a non-conducting state, approximating an open single-pole, single-throw switch that blocks the switched self-timed word line signal 506.

In another aspect of the present invention, a method of matching sense amplifier trigger signal timing to bit line separation timing includes steps of:

(a) providing a self-timed word line signal for a self-timed memory array;
(b) propagating a timing and a ramp rate of the self-timed word line signal to a selectable number of one or more self-timed pull-down core cells in response to a corresponding self-timed word line enable signal; and
(c) summing a self-timed bit line drive current over the selectable number of one or more self-timed pull-down core cells to generate a sense amplifier trigger signal.

FIG. 6 illustrates a flow chart 600 of a method of matching sense trigger signal timing to bit line separation timing according to an embodiment of the present invention.

Step 602 is the entry point of the flow chart 600.

In step 604, a self-timed word line signal is generated for a self-timed memory array according to well-known techniques. The self-timed word line signal has a timing delay and a ramp rate that tracks that of the worst case data word line in the self-timed memory array.

In step 606, the timing delay and the ramp rate of the self-timed word line signal is propagated, for example, by a transmission gate, to a selectable number of one or more self-timed pull-down core cells in response to a self-timed word line enable signal. The self-timed word line enable signal may be generated according to well-known techniques, for example, as a binary representation of the selected number of one or more self-timed pull-down core cells.

In step 608, when the self-timed word line enable signal is not asserted, the self-timed word line input of each of the selectable number of one or more self-timed pull-down core cells is referenced to ground, for example, by a pull-down device according to well-known techniques. The functions of the transmission gate and the pull-down device may be implemented according to well-known techniques, for example, by transistors.

In step 610, a summed self-timed bit line signal is generated by summing the self-timed bit line drive current of each of the selectable number of one or more self-timed pull-down core cells in response to the self-timed word line signal. The self-timed bit line signal of each of the self-timed pull-down core cells has a drive current that is substantially identical to the data bit line drive current of a data core cell in the self-timed memory array having the least bit line drive current in the memory array.

In step 612, a sense amplifier trigger signal is generated from the summed self-timed bit line signal. The sense amplifier trigger signal has a timing delay that matches the data bit line separation timing delay of the slowest data core cell in the memory column being read.

In step 614, the sense amplifier is triggered by the sense amplifier trigger signal to sense the state of the data core cell.

Step 616 is the exit point of the flow chart 600.

An important feature of the present invention is using both the timing delay and the ramp rate of the self-timed word line signal to generate the sense trigger signal. As a result, the sense amplifier senses the data bit lines at the proper time to ensure that the selected data core cell is read correctly. In addition, the data is ready to be read by an external circuit within the self-timed memory specification regardless of the type, size, and process variations in the self-timed memory array.

Although the method of the present invention illustrated by the flowchart description above is described and shown with reference to specific steps performed in a specific order, these steps may be combined, sub-divided, or reordered without departing from the scope of the claims. Unless specifically indicated herein, the order and grouping of steps is not a limitation of the present invention.

While the invention herein disclosed has been described by means of specific embodiments and applications thereof, numerous modifications and variations could be made thereto by those skilled in the art without departing from the scope of the invention set forth in the following claims.

What is claimed is:

1. A circuit for matching sense amplifier trigger signal timing to data bit line separation timing in a self-timed memory array comprising:
   a source of a self-timed word line signal for a self-timed memory array;
   a selectable number of one or more self-timed pull-down core cells for summing a self-timed bit line drive current of each of the selectable number of one or more self-timed pull-down core cells to generate a sense amplifier trigger signal; and
   a transmission gate coupled to the source of the self-timed word line signal for propagating a timing delay and a ramp rate of the self-timed word line signal to the selectable number of self-timed pull-down core cells in response to a corresponding self-timed word line enable signal.

2. The circuit of claim 1 wherein the self-timed bit line drive current of each of the selectable number of self-timed pull-down core cells is substantially identical to a data bit line drive current of a data core cell of the self-timed memory array.

3. The circuit of claim 1 wherein the self-timed bit line drive current of each of the selectable number of self-timed pull-down core cells is substantially identical to a smallest data bit line drive current of the self-timed memory array.

4. The circuit of claim 1 further comprising a pull-down device coupled to the transmission gate for referencing a self-timed word line input of each of the selectable number of self-timed pull-down core cells to ground when the corresponding self-timed word line enable signal is not asserted.

5. The circuit of claim 3 wherein the pull-down device comprises a transistor.

6. The circuit of claim 1 further comprising a sense inverter coupled to the selectable number of one or more self-timed pull-down core cells.

7. The circuit of claim 6 further comprising a sense amplifier coupled to the sense inverter.

8. The circuit of claim 7 further comprising a data core cell coupled to the sense amplifier.

9. The circuit of claim 1 wherein the transmission gate comprises a transistor.

10. A method comprising steps of:
   (a) providing a self-timed word line signal for a self-timed memory array;
   (b) propagating a timing and a ramp rate of the self-timed word line signal to a selectable number of one or more self-timed pull-down core cells in response to a corresponding self-timed word line enable signal; and
   (c) summing a self-timed bit line drive current over the selectable number of one or more self-timed pull-down core cells to generate a sense amplifier trigger signal.

11. The method of claim lo wherein the self-timed bit line drive current of each of the selectable number of self-timed pull-down core cells is substantially identical to a data bit line drive current of a data core cell of the self-timed memory array.

12. The method of claim 11 wherein the self-timed bit line drive current of each of the selectable number of self-timed pull-down core cells is substantially identical to a smallest data bit line drive current of the self-timed memory array.

13. The method of claim 10 further comprising a step of referencing a self-timed word line input of each of the selectable number of self-timed pull-down core cells to ground when the corresponding self-timed word line enable signal is not asserted.

14. An apparatus comprising:
   means for providing a self-timed word line signal for a self-timed memory array;
   means for propagating a timing and a ramp rate of the self-timed word line signal to a selectable number of one or more self-timed pull-down core cells in response to a corresponding self-timed word line enable signal; and
   means for summing a self-timed bit line drive current over the selectable number of self-timed pull-down core cells to generate a sense amplifier trigger signal.

15. The apparatus of claim 14 wherein the self-timed bit line drive current of each of the selectable number of self-timed pull-down core cells is substantially identical to a data bit line drive current of a data core cell of the self-timed memory array.

16. The apparatus of claim 14 wherein the self-timed bit line drive current of each of the selectable number of self-timed pull-down core cells is substantially identical to a smallest data bit line drive current of the self-timed memory array.

17. The apparatus of claim 14 further comprising means for referencing a self-timed word line input of each of the selectable number of self-timed pull-down core cells to ground when the corresponding self-timed word line enable signal is not asserted.

* * * * *